United States Patent
Park

(10) Patent No.: US 6,337,242 B1
(45) Date of Patent: Jan. 8, 2002

(54) METHOD FOR FABRICATING MIXED SIGNAL SEMICONDUCTOR DEVICE

(75) Inventor: Byung-Joo Park, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/551,527

(22) Filed: Apr. 18, 2000

(30) Foreign Application Priority Data

May 14, 1999 (KR) ............................................ 99-17337

(51) Int. Cl.[7] .......................................... H01L 21/8246
(52) U.S. Cl. ........................ 438/250; 438/239; 438/393
(58) Field of Search ................................ 438/250, 239, 438/210, 238, 251, 252, 393

(56) References Cited

U.S. PATENT DOCUMENTS

| | | | |
|---|---|---|---|
| 5,397,729 A | * 3/1995 | Kayanuma et al. | 438/250 |
| 5,434,098 A | 7/1995 | Chang | 437/60 |
| 5,618,749 A | * 4/1997 | Takahashi et al. | 438/384 |
| 5,683,931 A | * 11/1997 | Takahashi | 438/250 |
| 6,171,901 B1 | * 1/2001 | Blair et al. | 438/250 |

* cited by examiner

*Primary Examiner*—Michael Trinh
(74) *Attorney, Agent, or Firm*—Morgan, Lewis & Bockius LLP

(57) ABSTRACT

A method for fabricating a mixed signal semiconductor device is disclosed. This method includes a step for dividing a semiconductor substrate into an active region and a field region, step for forming a gate oxide film on an upper surface of the semiconductor substrate, a step for forming a first polysilicon film on an upper surface of the gate oxide film, a step for forming a silicon nitride film on an upper surface of the gate oxide film, a step for patterning the silicon nitride film and exposing a first polysilicon corresponding to the upper portion of the field region, a step for implanting an impurity ion into the first polysilicon film, a step for forming a capacitor oxide film on an upper and lateral surface of the patterned silicon nitride film and on an upper surface of the exposed first polysilicon film, a step for forming a second polysilicon film on an upper surface of the capacitor oxide film, a step for removing the second polysilicon film and the capacitor oxide film formed on the upper surface of the silicon nitride film and planerizing the remaining second polysilicon film, capacitor oxide film and silicon nitride film, a step for patterning the silicon nitride film, first polysilicon film and second polysilicon film, a step for etching the silicon nitride film, and a step for forming a LDD(Lightly Doped Drain) in the active region, for thereby implementing a simpler fabrication process and decreasing a failed product.

13 Claims, 5 Drawing Sheets

METHOD FOR FABRICATING MIXED SIGNAL SEMICONDUCTOR DEVICE

BACKGROUND OF THE INVENTION

1. Field of the Invention

The present invention relates to a method for fabricating a semiconductor device, and in particular to a method for fabricating a mixed-signal semiconductor device.

2. Description of the Background Art

A mixed-signal semiconductor device represents a semiconductor device in which a digital signal and an analog signal co-exist. As a digital signal generation unit, a transistor is known, which generates an ON and OFF signal based on whether a threshold voltage is exceeded or not. As an analog signal generation unit, a capacitor is known, which generates a signal classified based on the stored amount of electric charges. Since the capacitor stores an electric charge between two polysilicon films which are called as a plate poly and a gate poly, the structure of the same is called as a double poly structure. This structure is generally used for designing an analog circuit. The method for fabricating a mixed signal semiconductor device formed of the transistors and capacitors using the above-described double poly structure is well known. The above-described conventional fabrication method will be explained with reference to FIGS. 1A through 1E.

As shown in FIG. 1A, a buffer oxide film 2 is formed on an upper surface of a semiconductor substrate 1, and a trench 3 is formed on the semiconductor substrate 1 based on a STI(Shallow Trench Isolation) process, and an oxide 4 is filled in the trench 3. The region of the semiconductor substrate 1 is divided into an active region A and a field region F, and a well(not shown) is formed therein. Next, a first poly silicon film 5 is formed on the upper surfaces of the buffer oxide film 2 and the trench 3, and an impurity is implanted into the first polysilicon film 5. At this time, since the impurity is implanted into all the upper surface of the semiconductor substrate 1, the impurity may be implanted into the active region A of the semiconductor substrate 1. A capacitor oxide film 6 is formed on an upper surface of the first polysilicon film 5, and a first photoresist film 7 is formed on an upper surface of the capacitor oxide film 6, and then patterned for thereby remaining the first photoresist film 7 on the field region F.

Next, as shown in FIG. 1B, the capacitor oxide film 6 and the first polysilicon film 5 are patterned by a photolithography using the patterned first photoresist film 7 as a mask, and the buffer oxide film 2 and the oxide 4 neighboring the patterned first polysilicon film 5 is exposed. The buffer oxide film 2 may be damaged during the photolithography process. The above-described damage is an important problem in the conventional art which will be explained in detail later.

Ions are implanted into the semiconductor substrate for adjusting the threshold voltage of the transistor which will be formed in the next process. Thereafter, the first photoresist film 7 is removed, and the buffer oxide film 2 is removed using a fluoric acid, and as shown in FIG. 1C, a high quality gate oxide film 8 is formed on the region in which the buffer oxide film 2 is removed. However, the oxide 4 filled in the trench 3 which is exposed when exposing the buffer oxide 2 may be damaged. The above-described damage may degrade an isolation characteristic of the semiconductor device. Next, a second polysilicon film 9 is formed on the upper portions of the gate oxide film 8, the exposed oxide 4 and the patterned capacitor oxide film 6. Thereafter, a second photoresist film 10 is formed on a certain region of the second polysilicon film 9 for forming a gate and a gate poly.

Next, as shown in FIG. 1d, the second polysilicon film 9 is patterned by a photolithography using the second photoresist film 10 as a mask, and a gate of the transistor and a gate poly of capacitor are formed on the active region A and the field region F. At this time, a height difference "d" is formed between the second photoresist film 10 in the active region A and the second photoresist film 10 in the field region F. Therefore, it is difficult to accurately determine the dimensions of the widths of a gate and a gate poly during the photolithography which is implemented using the second photoresist film. In addition, since the second polysilicon film 9 remains non-etched on the lateral wall of the first polysilicon film 5. Next, the second photoresist film 10 is removed, and a known LDD(Lightly Doped drain) transistor fabrication process is performed, and then as shown in FIG. 1E, the method for fabricating a mixed signal semiconductor device formed of a transistor and a capacitor is completed.

In the above-described method for fabricating the mixed signal semiconductor device, the impurity may be implanted into the active region A of the semiconductor substrate 1 when implanting ions into the first polysilicon film 5, so that the threshold voltage of the transistor formed in the active region A is varied. In order to overcome the above-described problems, the impurity is prevented from being implanted into the active region A of the semiconductor substrate 1 by increasing the thickness of the buffer oxide film 2. In this case, there is a limit for adjusting the thickness of the oxide film, and when the thickness of the buffer oxide film 2 is increased, it takes longer time to remove the buffer oxide film 2, so that a fabrication efficiency is decreased.

In addition, the buffer oxide film 2 is removed before the gate oxide film 8 is formed. At this time, the oxide 4 filled in the trench 3 formed at an exposed portion may be damaged. In particular, the oxide 4 formed at a boundary portion between the active region A and the trench 3 may be significantly damaged. The above-described damage may degrade the isolation characteristic of the semiconductor device.

In addition, a height difference "d" is formed between the second photoresist film 10 of the active region A and the second photoresist film 10 of the field region F during the photolithography which is implemented using the second photoresist film 10. Therefore, it is difficult to accurately determined the dimensions of the widths of the transistor and the capacitor.

The characteristic of the capacitor may be degraded due to the second polysilicon film 9 which is formed at the lateral wall of the first polysilicon film 5, and the failed product may be increased, and the fabrication yield may be increased.

SUMMARY OF THE INVENTION

Accordingly, it is an object of the present invention to provide a method for fabricating a mixed signal semiconductor device which is capable of implementing a simpler fabrication process and decreasing a failed product.

To achieve the above objects, there is provided a method for fabricating a mixed signal semiconductor device which comprises the steps of a step for dividing a semiconductor substrate into an active region and a field region, step for forming a gate oxide film on an upper surface of the semiconductor substrate, a step for forming a first polysilicon film on an upper surface of the gate oxide film, a step for forming a silicon nitride film on an upper surface of the gate oxide film, a step for patterning the silicon nitride film and exposing a first polysilicon corresponding to the upper portion of the field region, a step for implanting an impurity ion into the first polysilicon film, a step for forming a capacitor oxide film on an upper and lateral surface of the patterned silicon nitride film and on an upper surface of the exposed first polysilicon film, a step for forming a second polysilicon film on an upper surface of the capacitor oxide film, a step for removing the second polysilicon film and the capacitor oxide film formed on the upper surface of the silicon nitride film and planerizing the remaining second polysilicon film, capacitor oxide film and silicon nitride film, a step for patterning the silicon nitride film, first polysilicon film and second polysilicon film, a step for etching the silicon nitride film, and a step for forming a LDD(Lightly Doped Drain) in the active region.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The method for fabricating a mixed signal semiconductor device according to the present invention will be explained with reference to FIGS. 2A through 2G.

Figure 1A:
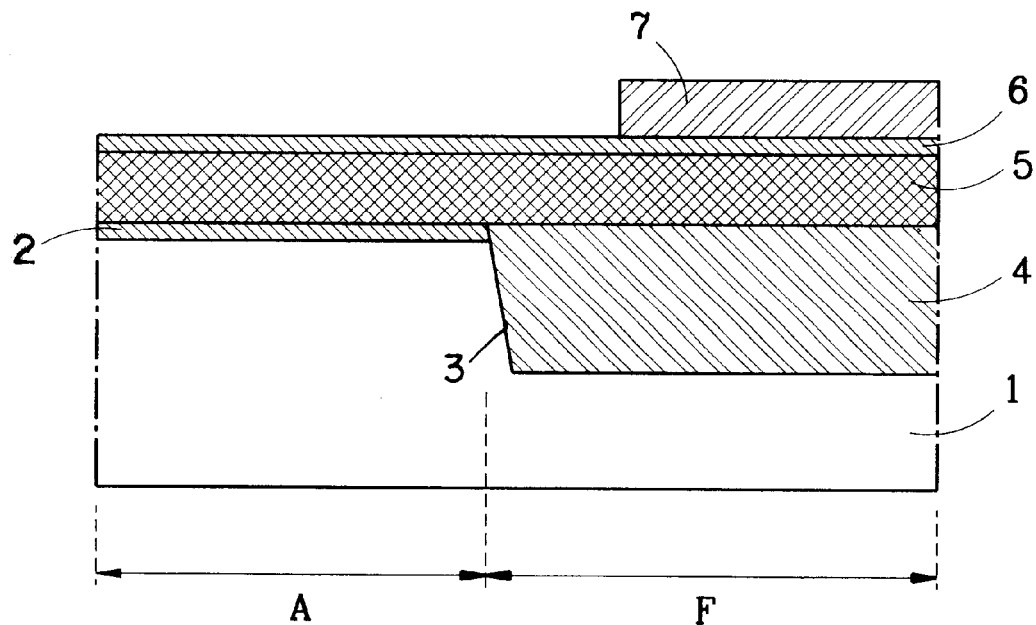
FIGS. 1A through 1E are cross-sectional views illustrating a conventional method for fabricating a mixed-signal semiconductor device.
Figure 1B:
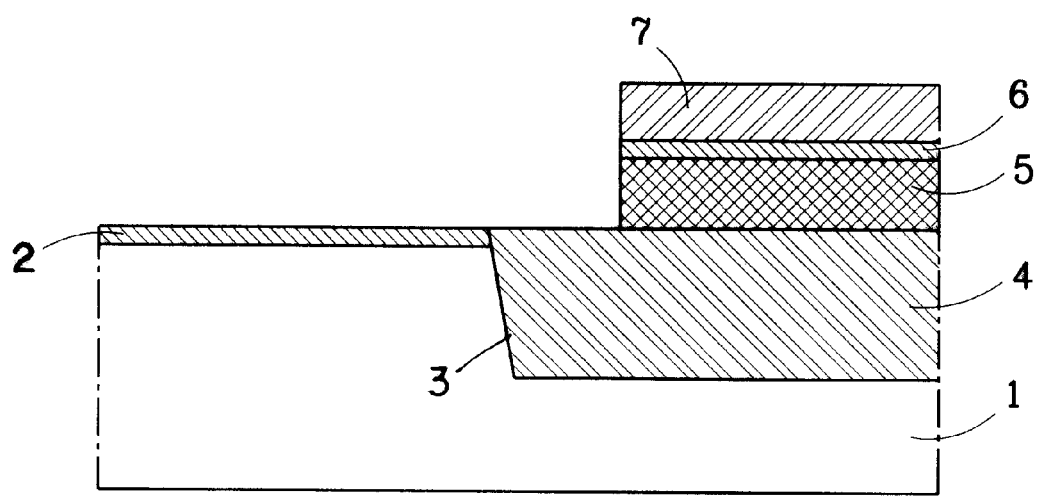
Figure 1C:
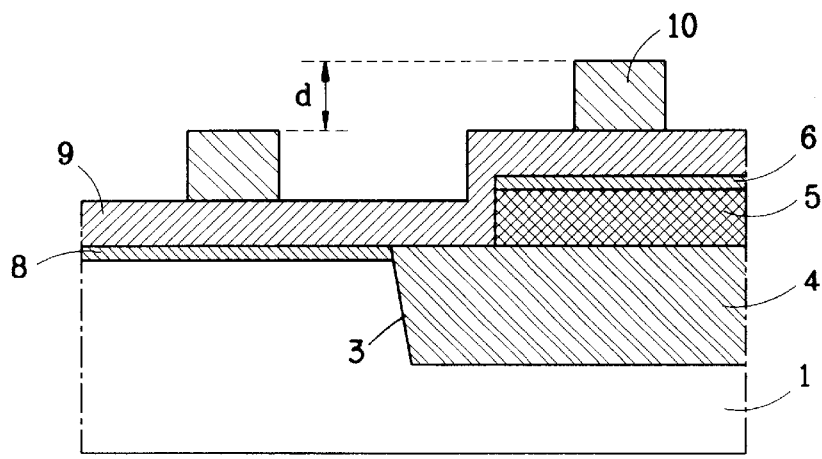
Figure 1D:
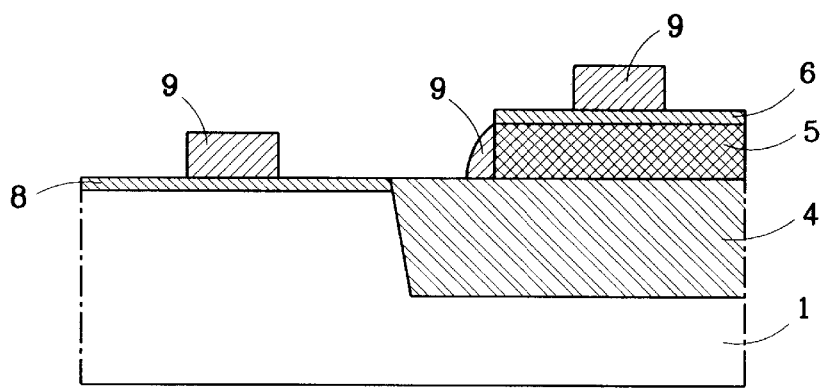
Figure 1E:
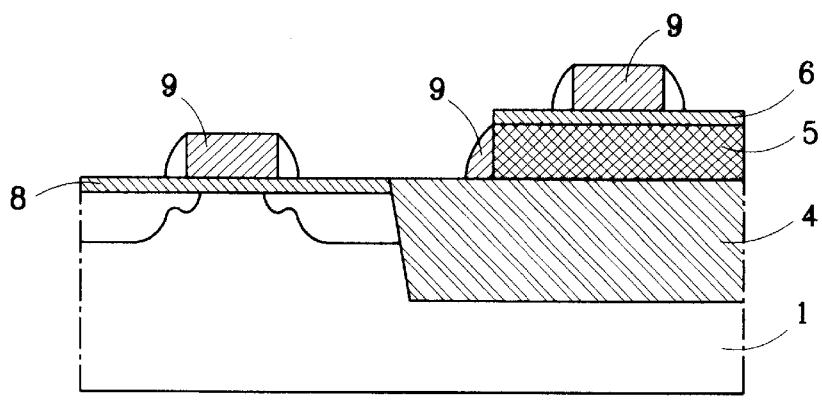
Figure 2A:
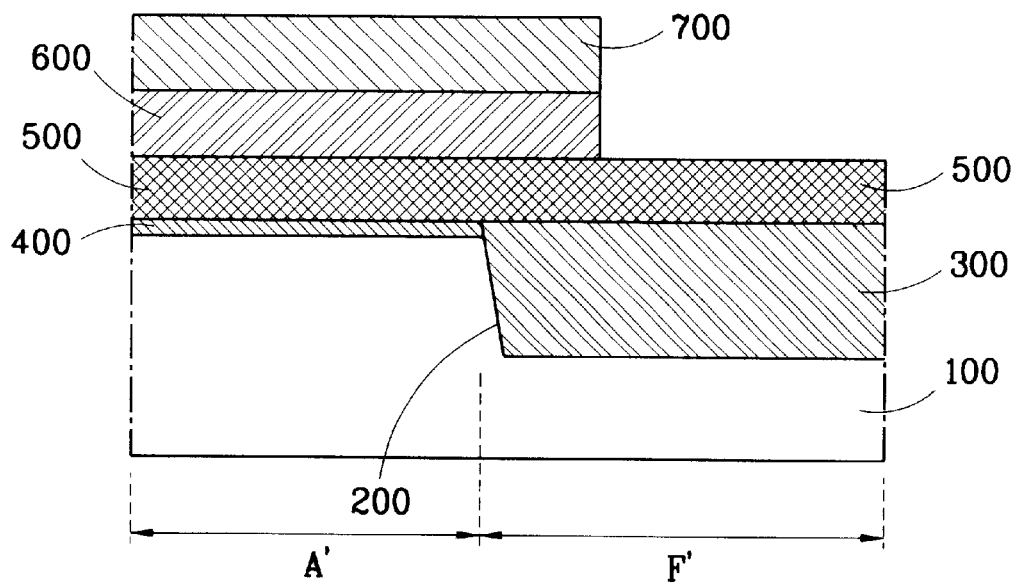
FIGS. 2A through 2G are cross-sectional views illustrating a method for fabricating a mixed-signal semiconductor device according to the present invention.

As shown in FIG. 2A, a trench 200 is formed in a semiconductor substrate 100 by a STI(Shallow Trench Isolation) process, and an oxide 300 is filled in the trench 200, and the region of the semiconductor substrate 100 is divided into an active region A' and a field region F' and then a well(not shown) is formed. Ions are implanted into the semiconductor substrate to adjust the threshold voltage of a transistor which will be formed later, and then a gate oxide film 400 is formed on an upper surface of the semiconductor substrate 100. At this time, a gate oxide film 400 formed on an upper surface of the oxide 300 filled in the trench 200 is not separated from other materials such as the oxide 300, in the drawings, the gate oxide 300 is assumed to be included in the oxide 300. Next, a first polysilicon film 500 is formed on an upper surface of the gate oxide film 400, and a silicon nitride film 600 is formed on an upper surface of the first polysilicon film 500, and a first photoresist film 700 is formed on an upper surface of the silicon nitride film 600. Thereafter, the first photoresist film 700 is patterned, and a silicon nitride film 600 corresponding to the upper portion of the field region F' is exposed. Thereafter, the silicon nitride film corresponding to the upper portion of the field region F' is etched and patterned using the patterned first photoresist film 700 as a mask for thereby exposing the first polysilicon film 500.

Figure 2B:
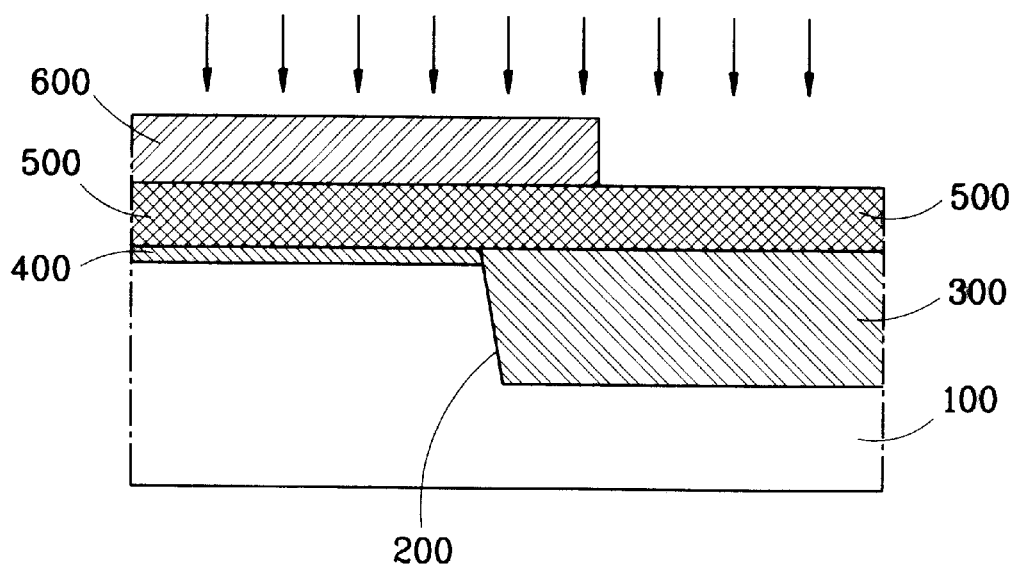

Next, as shown in FIG. 2B, the first photoresist film 700 is removed, and ions are implanted into all the upper surface of the semiconductor substrate, so that an impurity is implanted into the first polysilicon film 500. At this time, since the patterned silicon nitride film 600 acts as a mask, the impurity is ion-implanted into only the exposed first polysilicon film 500.

Figure 2C:
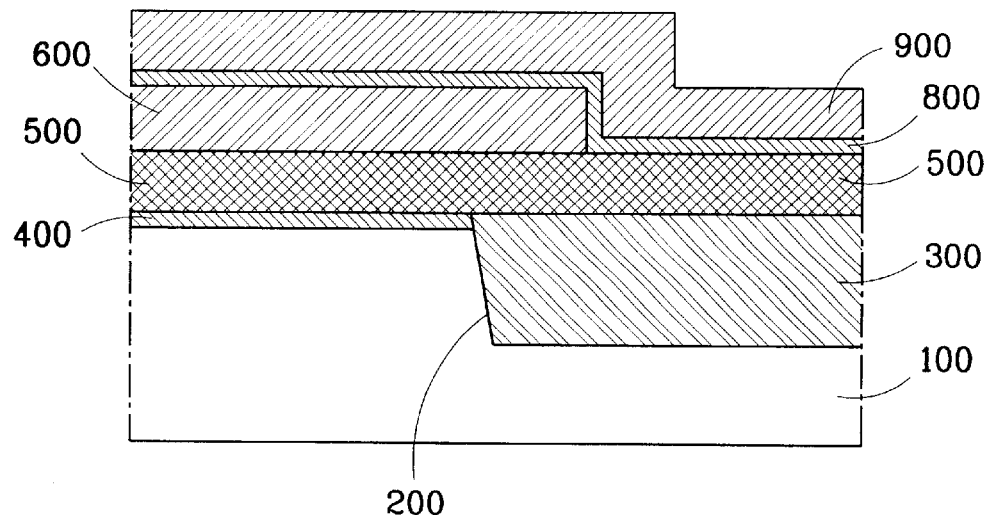

As shown in FIG. 2C, a capacitor oxide film 800 is formed on an upper and lateral surfaces of the patterned silicon nitride film 600 and on an upper surface of the exposed first polysilicon film 500 by a chemical vapor deposition method or thermal oxide method. At this time, the capacitor oxide film 800 may be formed of a silicon oxide or may be formed in a sequentially stacked structure of silicon oxide, silicon nitride and silicon oxide. A second polysilicon film 900 is formed on an upper surface of the capacitor oxide film 800 by a low pressure chemical vapor deposition method.

Figure 2D:
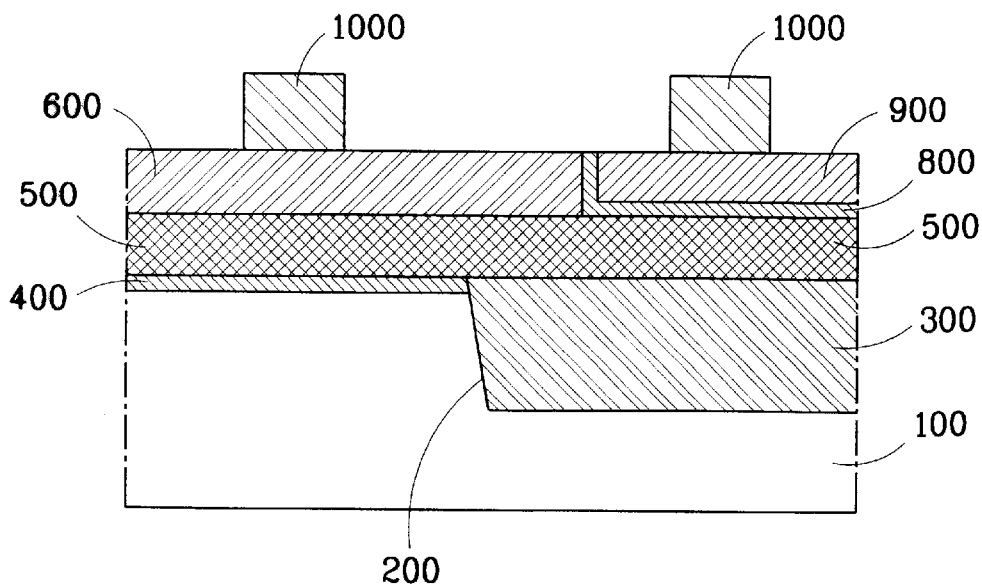

Thereafter, as shown in FIG. 2d, the second polysilicon film 900 in the active region A and the capacitor oxide film 800 formed on the upper surface of the silicon nitride film 600 are removed, and the second polysilicon film 900 in the field region F', the silicon nitride film 600 and the capacitor oxide film 800 are planerized. As a result, the silicon nitride film 600, the capacitor oxide film 800 and the second polysilicon film 900 are exposed at the same height. Next, a second photoresist film 1000 is formed on the regions of the silicon nitride film 600 and the second polysilicon film 900 for forming a gate of the transistor and a gate poly of the capacitor which will be formed later.

Figure 2E:
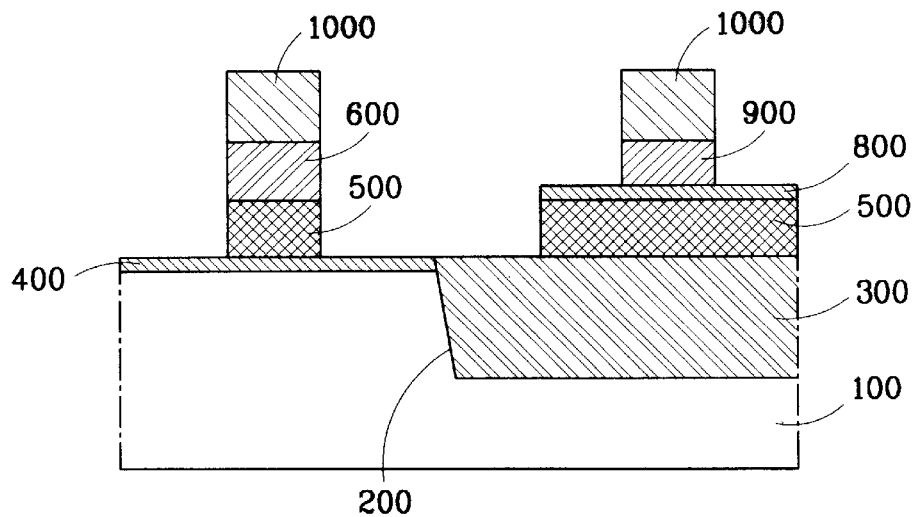

As shown in FIG. 2E, the silicon nitride film 600, the first polysilicon film 500 and the second polysilicon film 900 are sequentially etched using the second photoresist film 1000 as a mask. At this time, since the capacitor oxide film 800 formed in the field region F' acts as a mask, the first polysilicon film 500 formed below the same is not etched. As a result, the first polysilicon film 500 remaining in the active region A' corresponds to the gate of the transistor, and the second polysilicon film 900 remaining in the field region F' corresponds to the gate poly of the capacitor. In addition, the first polysilicon film 500 formed in the field region F' corresponds to the plate poly. Therefore, it is possible to implement a capacitor of a double poly structure formed of a gate poly and a plate poly. In addition, since the second photoresist film in the active region A' and the second photoresist film in the field region F' have the same height, it is possible to easily adjust the focus during the photolithography in which the second photoresist film is used as a mask. Therefore, it is possible to pattern a gate and a gate poly which have an accurate width dimension.

Figure 2F:
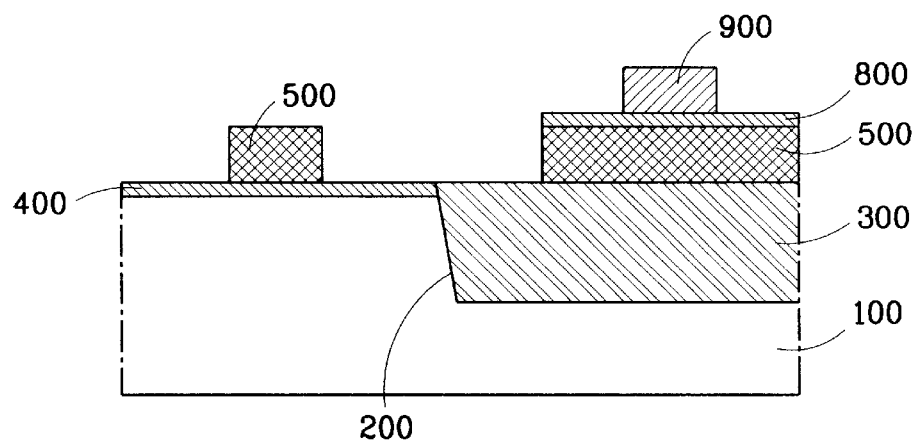

As shown in FIG. 2F, the silicon nitride film 600 is etched after the second photoresist film 1000 is removed. At this time, the silicon nitride film 600 is etched using a dry etching method or a wet etching method.

Figure 2G:
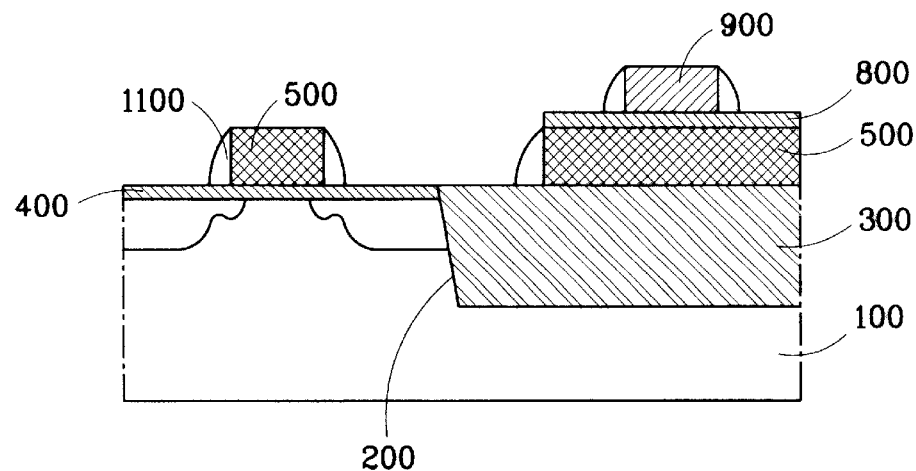

As shown in FIG. 2G, a lightly doped ion implantation process, a lateral wall(1100) formation process, and a highly doped ion implantation processes are sequentially performed for fabricating the LDD transistor in the active region A', so that the process for fabricating a mixed signal semiconductor device formed of a transistor and capacitor is finished.

As described above, in the method for fabricating a mixed signal semiconductor device, since the silicon nitride film 600 acts as a mask when ion-implanting into the first polysilicon film 500, an impurity ion is implanted into only the first polysilicon film in the field region. Therefore, in the present invention, it is possible to overcome the problems encountered in the conventional art in which the impurity is implanted into the active region of the semiconductor substrate for thereby changing the threshold voltage of the transistor.

In the present invention, since the capacitor oxide film is directly formed without a buffer oxide film formation and removing process, it is possible to prevent the problems encountered in the conventional art in which the oxide filled in the trench exposed on the upper surface when removing the buffer oxide film is damaged, and in particular the oxide formed at a boundary portion between the active region and the trench may be significantly damaged resulting in the degradation of the isolation characteristic of the semiconductor device is degraded. In addition, in the present invention, since the buffer oxide film formation and removing processes are omitted, a simpler process is implemented.

In the present invention, since the second photoresist film in the active region and the second photoresist film in the field region have the same height, an easier focus control is implemented based on the photolithography in which the second photoresist film is used as a mask. Therefore, it is possible to obtain an accurate dimension of the width of the gate and the gate poly based on the patterning process, so that a stabilized characteristic of the device is obtained.

As a result of the photolithography for forming the gate, since the second polysilicon is not formed at the lateral wall of the first polysilicon, it is possible to prevent the conventional art problems that the characteristic of the capacitor is changed due to the second polysilicon film formed at the lateral wall of the first polysilicon film. Therefore, in the present invention, it is possible to implement a more reliable capacitor of the stable double poly structure and prevent an error occurrence factor during the following processes for thereby significantly enhancing the fabrication yield of the products.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a mixed signal semiconductor device, comprising:

a step for dividing a semiconductor substrate into an active region and a field region;

a step for forming a gate oxide film on an upper surface of the semiconductor substrate;

a step for forming a first polysilicon film on an upper surface of the gate oxide film;

a step for forming a silicon nitride film on an upper surface of the first polysilicon film;

a step for patterning the silicon nitride film and exposing a first polysilicon corresponding to the upper portion of the field region;

a step for implanting an impurity ion into the first polysilicon film;

a step for forming a capacitor oxide film on an upper and lateral surface of the patterned silicon nitride film and on an upper surface of the exposed first polysilicon film;

a step for forming a second polysilicon film on an upper surface of the capacitor oxide film;

a step for removing the second polysilicon film and the capacitor oxide film formed on the upper surface of the silicon nitride film and planerizing the remaining second polysilicon film, capacitor oxide film and silicon nitride film;

a step for patterning the silicon nitride film, first polysilicon film and second polysilicon film;

a step for etching the silicon nitride film; and a step for forming a LDD(Lightly Doped Drain) in the active region.

2. The method of claim 1, wherein said step for dividing the semiconductor substrate into the active region and field region is implemented by forming a trench in the semiconductor substrate and filling an oxide into the trench.

3. The method of claim 1, wherein an oxide is filled in the trench for thereby forming the field region, and an ion is implanted into the semiconductor substrate for controlling a threshold voltage of the transistor, and a gate oxide film is formed.

4. The method of claim 1, wherein said patterning operation of the silicon nitride film is implemented by forming a first photoresist film on an upper surface of the silicon nitride film corresponding to an upper portion of the active region and by a photolithography process using the first photoresist film as a mask.

5. The method of claim 1, wherein when implanting an impurity ion into the first polysilicon film, since the silicon nitride film acts as a mask, the impurity ion is implanted into an exposed portion of the first polysilicon film corresponding to the upper portion of the field region.

6. The method of claim 1, wherein said capacitor oxide film is formed by a chemical vapor deposition method or a thermal oxide film.

7. The method of claim 1, wherein said capacitor oxide film is formed of a silicon oxide or is formed in a stacked structure in which a silicon oxide, a silicon nitride and a silicon oxide are sequentially stacked.

8. The method of claim 1, wherein said second polysilicon film is formed by a low pressure chemical vapor deposition method.

9. The method of claim 1, wherein the second polysilicon film and capacitor oxide film formed on the upper surface of the silicon nitride film are removed, and the remaining second polysilicon film, the capacitor oxide film and the silicon nitride film are planerized by a chemical mechanical polishing process, and said chemical mechanical process is performed until the silicon nitride film, capacitor oxide film and second polysilicon film are formed at the same height.

10. The method of claim 1, wherein said step for patterning the silicon nitride film, first polysilicon film and second polysilicon is implemented by forming a second photoresist film on a certain region of each of the silicon nitride film and second polysilicon film and sequentially etching the silicon nitride film, first polysilicon film and second polysilicon film by the dry etching method using the second photoresist film as a mask.

11. The method of claim 10, wherein when etching the second polysilicon film, since the capacitor oxide film in the field region acts as a mask, the first polysilicon film formed below the capacitor oxide film is not etched.

12. The method of claim 1, wherein said step for etching the silicon nitride film is implemented by the dry etching method or wet etching method.

13. The method of claim 1, wherein said step for forming the LDD transistor is implemented by sequentially performing a lightly doped ion implantation process, a lateral wall formation process and a highly doped ion implantation process.

* * * * *